US007786590B2

(12) United States Patent
Chung

(10) Patent No.: US 7,786,590 B2
(45) Date of Patent: Aug. 31, 2010

(54) SEMICONDUCTOR PACKAGE WITH IMPROVED SIZE, RELIABILITY, WARPAGE PREVENTION, AND HEAT DISSIPATION AND METHOD FOR MANUFACTURING THE SAME

(75) Inventor: Qwan Ho Chung, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 98 days.

(21) Appl. No.: 11/924,689

(22) Filed: Oct. 26, 2007

(65) Prior Publication Data
US 2009/0065923 A1    Mar. 12, 2009

(30) Foreign Application Priority Data
Sep. 10, 2007    (KR) ............... 10-2007-0091754

(51) Int. Cl.
*H01L 23/48* (2006.01)
*H01L 23/52* (2006.01)
*H01L 29/40* (2006.01)

(52) U.S. Cl. ............... 257/774; 257/E23.011
(58) Field of Classification Search ............ 257/779, 257/774, 706, E23.011
See application file for complete search history.

(56) References Cited
U.S. PATENT DOCUMENTS 5,521,438 A * 5/1996 Okamoto et al. ........ 257/703
5,877,561 A * 3/1999 Kim .................... 257/796
6,489,676 B2   12/2002 Taniguchi et al.
6,590,291 B2 * 7/2003 Akagawa ............... 257/774
6,646,334 B2   11/2003 Hur
6,759,272 B2   7/2004 Tsubosaki et al.
6,774,478 B2   8/2004 Eto et al.
6,847,109 B2   1/2005 Shim
6,900,074 B2   5/2005 Miyamoto et al.
7,256,072 B2 * 8/2007 Shiozawa et al. ......... 438/109
7,514,770 B2 * 4/2009 Chang et al. ............ 257/678
2007/0085188 A1   4/2007 Chang et al.

FOREIGN PATENT DOCUMENTS

| CN | 1449232 A | 10/2003 |
| CN | 1858825 A | 11/2006 |
| JP | 10-041425 A | 2/1998 |
| JP | 2002-026187 A | 1/2002 |
| KR | 101999025444 A | 4/1999 |

* cited by examiner

Primary Examiner—David A Zarneke
Assistant Examiner—Jenny L Wagner
(74) Attorney, Agent, or Firm—Ladas & Parry LLP

(57) ABSTRACT

The semiconductor package includes a semiconductor package module with circuit patterns formed on an insulation substrate, at least two semiconductor chips electrically connected to each of the circuit patterns using bumps, and an insulation member filled in any open space in the semiconductor module. A cover plate is formed on the upper portion of the semiconductor package module, and a penetration electrode penetrates the semiconductor package. The penetration electrode is electrically connected to the circuit patterns. The described semiconductor package improves upon important characteristics such as size, reliability, warpage prevention, and heat dissipation.

17 Claims, 17 Drawing Sheets

SEMICONDUCTOR PACKAGE WITH IMPROVED SIZE, RELIABILITY, WARPAGE PREVENTION, AND HEAT DISSIPATION AND METHOD FOR MANUFACTURING THE SAME

CROSS-REFERENCE TO RELATED APPLICATIONS

The present application claims priority to Korean patent application number 10-2007- filed on, 2007, which is incorporated herein by reference in its entirety.

BACKGROUND OF THE INVENTION

The present invention relates to a semiconductor package and a method for manufacturing the same.

In general, manufacturing a semiconductor package includes three processes: a semiconductor chip manufacturing process, an electrical inspection process, and a packaging process. During the semiconductor chip manufacturing process, elements such as transistors, a resistors, and capacitors are formed on a wafer. During the electrical inspection process, semiconductor chips are inspected electrically to differentiate between good and bad semiconductor chips. The packaging process protects the brittle semiconductor chips from externally applied shock and/or vibration The semiconductor package with the semiconductor elements is applied to personal computers, television receivers, home appliances, information and communication equipment, and the like.

In recent years, developments in semiconductor packaging technology have led to a "chip scale package" having a size no more than 100-105% of a semiconductor chip. These developments have also led to a "stack semiconductor package" in which a plurality of semiconductor chips and/or semiconductor packages are stacked. The "stack semiconductor package" is able to improve data storage capacity and data processing speed.

BRIEF SUMMARY OF THE INVENTION

The present invention provides a semiconductor package, and more specifically a semiconductor package in which characteristics such as size, reliability, warpage prevention, and heat dissipation are improved.

The present invention also provides a method for manufacturing the semiconductor package with these improved characteristics.

A semiconductor package according to the present invention comprises a semiconductor package module with circuit patterns formed on an insulation substrate, at least two semiconductor chips electrically connected to each of the circuit patterns, and an insulation member filled between the open spaces of the semiconductor chip module, A penetration electrode then penetrates the entire width of the semiconductor package, and the penetration electrode is electrically connected to the circuit patterns.

In the semiconductor package, the circuit patterns may contain copper.

A plating layer covers the outer surfaces of the circuit patterns. The plating layer covering the circuit patterns contains one of the following: gold, palladium, and nickel.

A plurality of external circuit patterns is formed on the lower surface of the isolation substrate. The external circuit patterns are electrically connected to the penetration electrode. The insulation substrate further includes conductive balls electrically connected to the external circuit patterns. Also, on the upper surface of the insulation substrate, electrical elements are formed. The electrical elements may be transistors, resistors, and capacitors, and the electrical elements are electrically connected to the circuit patterns.

Included in the semiconductor package is a cover plate which covers the semiconductor package module.

An adhesive member is formed on the cover plate of the semiconductor package in order to adhere the cover plate to the semiconductor chips.

The cover plate of the semiconductor package may also include a heat dissipation member. The heat dissipation member is formed between the semiconductor chip and the face plate, and is used to dissipate heat generated from the semiconductor chip.

External circuits patterns connected to the penetration electrode are additionally arranged on the cover plate of the semiconductor package.

The penetration electrode of the semiconductor package includes metal seed patterns arranged on a surface of the penetration electrode.

The semiconductor chips of the semiconductor package include bumps that are used to connect the semiconductor chips to the circuit patterns in a flip-chip method.

Alternatively, the semiconductor chips of the semiconductor package can be formed on the insulation substrate. The bonding pads of the semiconductor chips are then connected to the circuit patterns using conductive wires.

A plurality of the semiconductor chip modules of the semiconductor package can be stacked.

A method for manufacturing a semiconductor package according to the present invention comprises the steps of forming a semiconductor package module by forming circuit patterns in an insulation substrate, forming a bump on each circuit pattern, placing at least two semiconductor chips on the bumps, filling an insulation member filled between any gaps in the semiconductor package module; covering the semiconductor package module with a cover plate; and forming a penetration electrode penetrating the entire width of the semiconductor package module.

In the method for manufacturing a semiconductor package, the step of forming the semiconductor package module includes a step of forming a plating layer on the circuit patterns. The plating layer includes a metal selected from gold, palladium, and nickel.

In the method for manufacturing a semiconductor package, the bumps are electrically connected the bonding pads of the semiconductor chips, thereby electrically connecting the chips to the circuit patterns.

In the method for manufacturing a semiconductor package, prior to the step of arranging an insulation member between the semiconductor chips, electrical elements such as transistors, resistors, and capacitors can be added to the insulation substrate. The electrical elements are electrically connected to the circuit patterns.

In the method for manufacturing a semiconductor package, after the step of filling the insulation member, the top surface of the semiconductor chips and the insulation member may be polished.

When manufacturing the semiconductor package, prior to the step adding the cover plate, there a heat dissipation member can be formed on the bottom surface of the cover plate. The heat dissipation member may include a penetration hole in the area surrounding the penetration electrode in order to prevent a short circuit. The heat dissipation member is used to dissipate the heat generated by the semiconductor chips.

In the method for manufacturing a semiconductor package, when applying the adhesive member to the cover plate (or alternatively to the semiconductor chip), an adhesive material is melted by heat.

In the method for manufacturing a semiconductor package, after the step of forming the semiconductor package module, external circuit patterns may be formed on the outer surface of the insulation substrate. The external circuit patterns are electrically connected to the penetration electrode.

In the method for manufacturing a semiconductor package, the step of forming the external circuit pattern includes the steps of forming a metal film on the outer surface of the insulation substrate, and the patterning the metal film.

In the method for manufacturing a semiconductor package, the step of forming the penetration electrode includes the steps of forming a via hole penetrating the entire width of the insulation substrate including the insulation member, and the cover plate; forming a seed metal layer on the inner surface of the via hole; and filling a conductive material within the via hole using the seed metal layer.

In the method for manufacturing a semiconductor package, a plurality of penetration electrodes may be formed instead of just one.

In an alternative method for manufacturing a semiconductor package, the semiconductor chip may be formed on the surface of the insulation substrate, and the circuit patterns are then electrically connected to one another using conductive wires.

In this method, the conductive wires are covered by the insulation member when the insulation member fills the empty space in the semiconductor chip module.

In the method for manufacturing a semiconductor package, a plurality of semiconductor package modules may be stacked before the cover plate is attached.

When the semiconductor chips are stacked in this manner, an adhesive member is interposed between the semiconductor package modules.

DESCRIPTION OF SPECIFIC EMBODIMENTS

Figure 1:
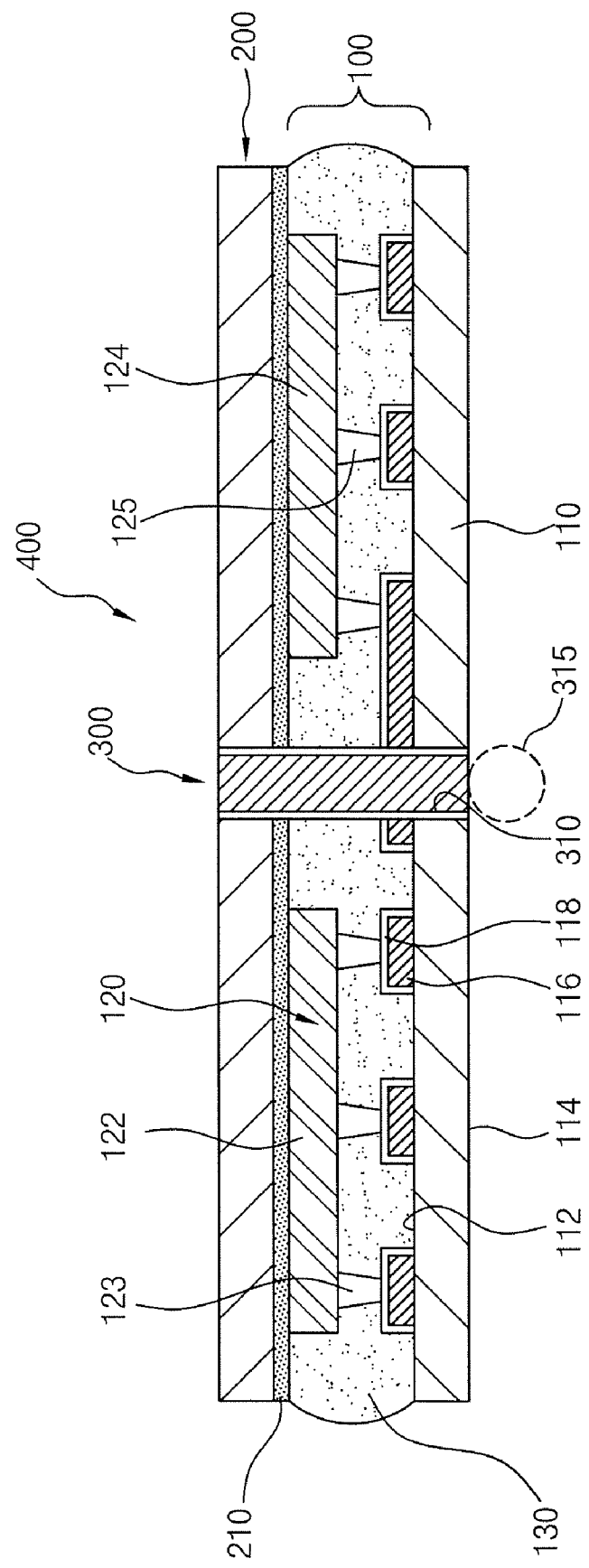
FIG. 1 is a cross-sectional view illustrating a semiconductor package in accordance with a first embodiment of the present invention.

FIG. 1 is a cross-sectional view illustrating a semiconductor package in accordance with a first embodiment of the present invention.

Referring to FIG. 1, a semiconductor package 400 includes a semiconductor package module 100 and a penetration electrode 300. In addition, the semiconductor package 400 may also include a cover plate 200.

The semiconductor package module 100 includes an insulation substrate 110, semiconductor chips 120, and insulation members 130.

The insulation substrate 110 may have, for example, a plate-shape. The insulation substrate 110 has a first surface 112 and a second surface 114 that is opposite the first surface 112.

Figure 2:
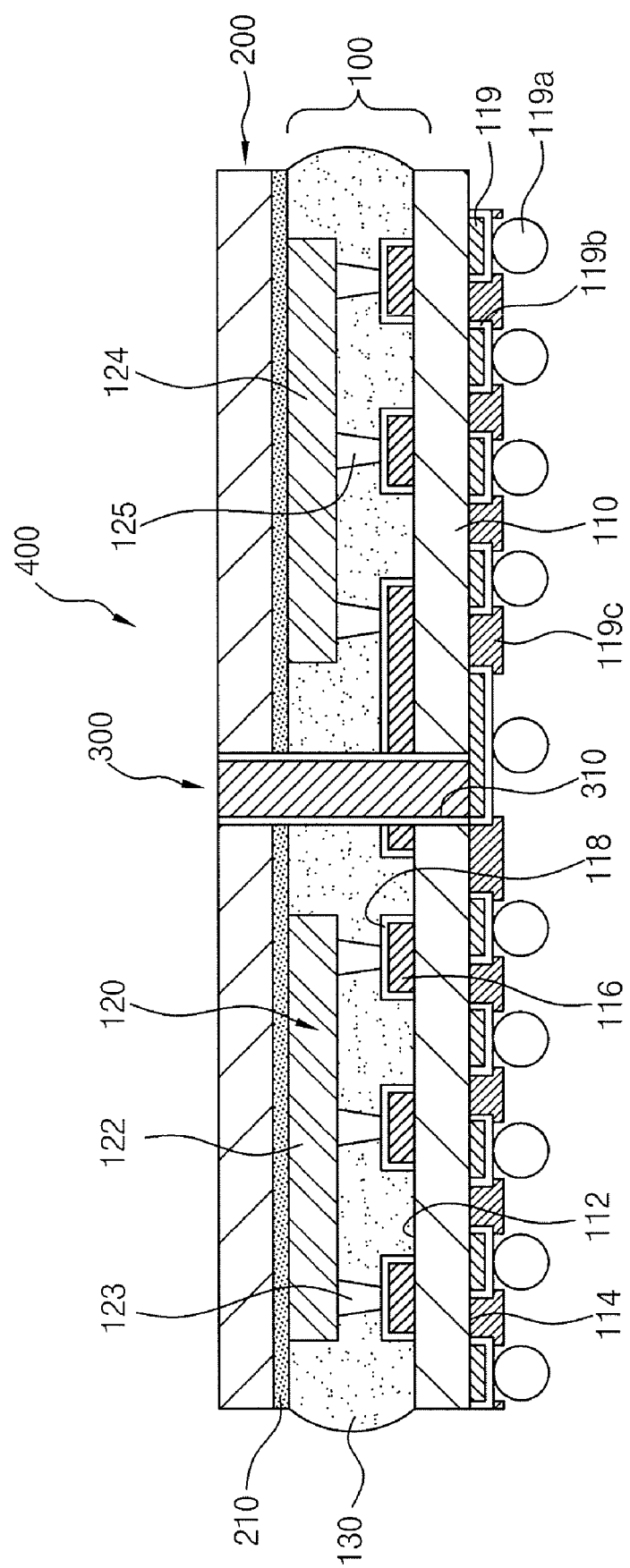
FIG. 2 is a cross-sectional view illustrating external circuit patterns arranged on the insulation substrate illustrated in FIG. 1.

Circuit patterns 116 are located on the insulation substrate 110. As can be seen in FIG. 2, the external circuit patterns 119 and conductive balls 199a may also be included on the insulation substrate 110.

Referring back to FIG. 1, the circuit patterns 116 are arranged on the first surface 112 of the insulation substrate 110. The circuit patterns 116 are electrically connected to semiconductor chips 120 and a penetration electrode 300 (both of which will be described in more detail later). The circuit patterns 116, for example, may contain copper.

A plating layer 118 may be formed on the surface of the circuit patterns 116 in order to improve the adhesive force of the circuit patterns 116 and solder bumps of each semiconductor chip 120. Examples of material that may be used for the plating layer 118 include gold, nickel, palladium, and alloys of these materials.

FIG. 2 is a cross-sectional view illustrating external circuit patterns arranged on an insulation substrate as illustrated in FIG. 1.

Referring to FIG. 2, external circuit patterns 119 are arranged on a second surface 114 of the insulation substrate 110. The external circuit patterns 119 may contain, for example, copper, and the external circuit patterns 119 are electrically connected to a penetration electrode 300 (which will be described in more detail later).

In order to improve the adhesive force of the external circuit patterns 119 and conductive balls 119a, a plating layer 119b may be formed on the surfaces of the external circuit patterns 119. Examples of material that may be used for the plating layer 119b include gold, nickel, palladium, and alloys of these materials.

The conductive balls 119a are electrically connected to the external circuit patterns 119. Therefore, when a signal is received through the conductive balls 119a, the signal is then provided to the semiconductor chips 120 through the external circuit patterns 119 and the penetration electrode 300.

Figure 3:
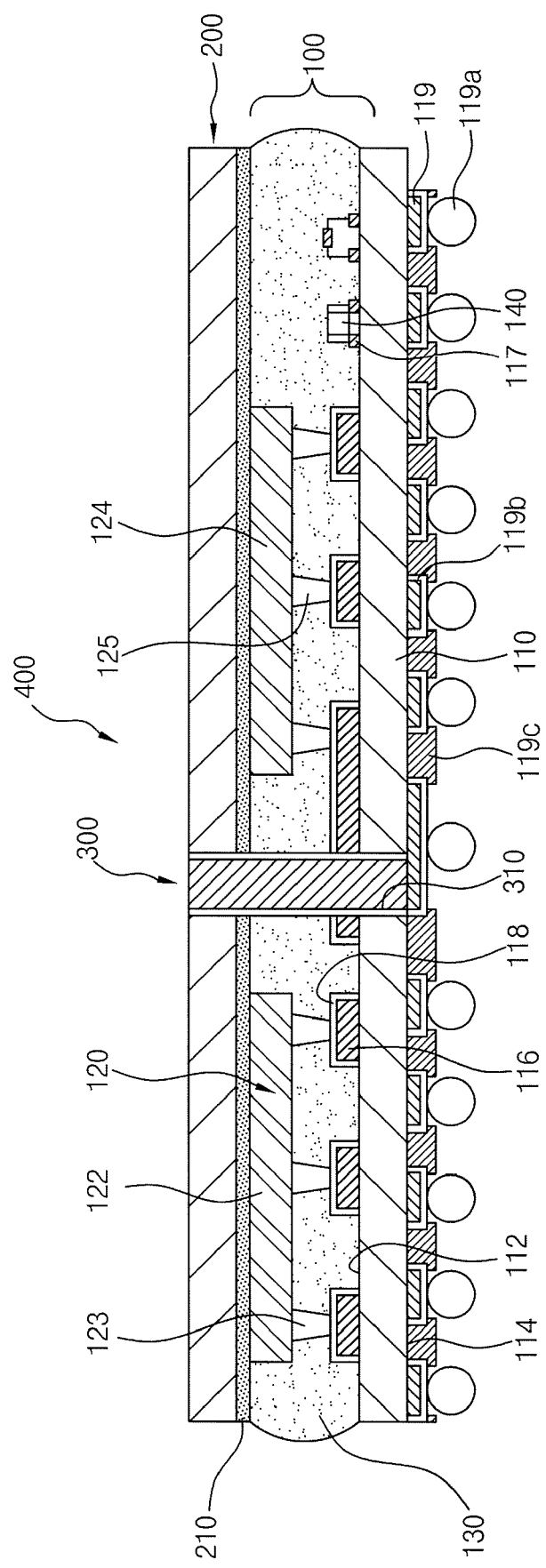
FIG. 3 is a cross-sectional view illustrating electrical elements arranged on the insulation substrate illustrated in FIG. 1.

FIG. 3 is a cross-sectional view illustrating electrical elements arranged on an insulation substrate as illustrated in FIG. 1.

Referring to FIG. 3, electrical elements 140 may be arranged on the insulation substrate 110. The electrical elements 140 are electrically connected to circuit patterns for electrical elements 117 The circuit patterns for electrical elements 117 are also arranged on the first surface 112 of the insulation substrate 110. The circuit patterns for electrical elements 117 are electrically connected to circuit patterns 116 arranged on the first surface 112 of the insulation substrate 110.

In this embodiment, the circuit patterns for electrical elements 117 may include electrical elements such as transistors, capacitors, resistors, inductors, and the like.

Referring to FIG. 1 again, the semiconductor chips 120 of the semiconductor package module 100 are electrically connected to each of the circuit patterns 116. Hereinafter, the semiconductor chips 120 are defined as a first semiconductor chip 122 and a second semiconductor chip 124.

In this embodiment, the first and the second semiconductor chips 122 and 124 good quality semiconductor chips that have been diced from a wafer (not shown) and selected, for example, using an electrical die sorting (EDS) process.

The first and the second semiconductor chips 122 and 124 include, for example, bonding pads (not shown) and bumps 123 and 125 that are electrically connected to each of the bonding pads. In this embodiment, the bumps 123 and 125 are electrically connected to circuit patterns 116 in a flip-chip method. By forming a plating layer 118 on the circuit patterns 116, the adhesive force of the circuit patterns 116 and the bumps 123 and 125 can be greatly improved.

In this embodiment, when the first and the second semiconductor chips 122 and 124 are electrically connected directly to the circuit patterns 116, the transmission path of data being inputted to the first and the second semiconductor chips 122 and 124 and the transmission path of data being outputted from the first and the second semiconductor chips 122 and 124 is shortened. By shortening the transmission path the first and second semiconductor chips 122 and 124 can input and output data at a higher speed.

By connecting the bumps 123 and 125 of the first and second semiconductor chips 122 and 124 to the circuit patterns 116 in a flip-chip method, the thickness of the semiconductor package module 100 can be reduced, and the reliability of the semiconductor package module 100 can be improved.

Referring again to FIG. 1, the insulation member 130 of the semiconductor package module 100 is formed in the area between the semiconductor chips 122 and 124 and the first surface 112 of the insulation substrate 110, and also in the area to the side of the first and second semiconductor chips 122 and 124. The insulation member 130 closes in the gap between the semiconductor chips 122 and 124 and the first surface 112 of the insulation substrate 110, and improves the adhesive force between the semiconductor chips 122 and 124 and the insulation substrate 110.

In this embodiment, the side surface of both the first and second semiconductor chips 122 and 124 is covered by the insulation member 130, and portions of the bottom surface of the first and second semiconductor chips 122 and 124 on which bumps 125 and 123 are arranged are, of course, not covered by insulation member 130.

The insulation member 130 may include, for example, a heat-curing material that has been cured by heat, and a photo-curing material that has been cured by light such as ultraviolet rays.

The cover plate 200 is arranged on the semiconductor package module 100 having the insulation substrate 110, semiconductor chips 120, and insulation member 130.

The cover plate 200 typically has, for example, a plate-shape. The cover plate 200 is in contact with a bottom surface of the first and second semiconductor chips 122 and 124. The cover plate 200 protects the first and second semiconductor chips 122 and 124 from externally applied shock and/or vibration.

Located on the bottom of the cover plate 200 is an adhesive member 210. The adhesive member 210 is used to attach the cover plate 200 to the semiconductor package module 100. As seen in FIG. 1, the adhesive member 210 is interposed between the cover plate 200 and the first and second semiconductor chips 122 and 124. Heat is typically used on the adhesive member 210 to physically adhered the cover plate 200 to the semiconductor package module 100.

Figure 4:
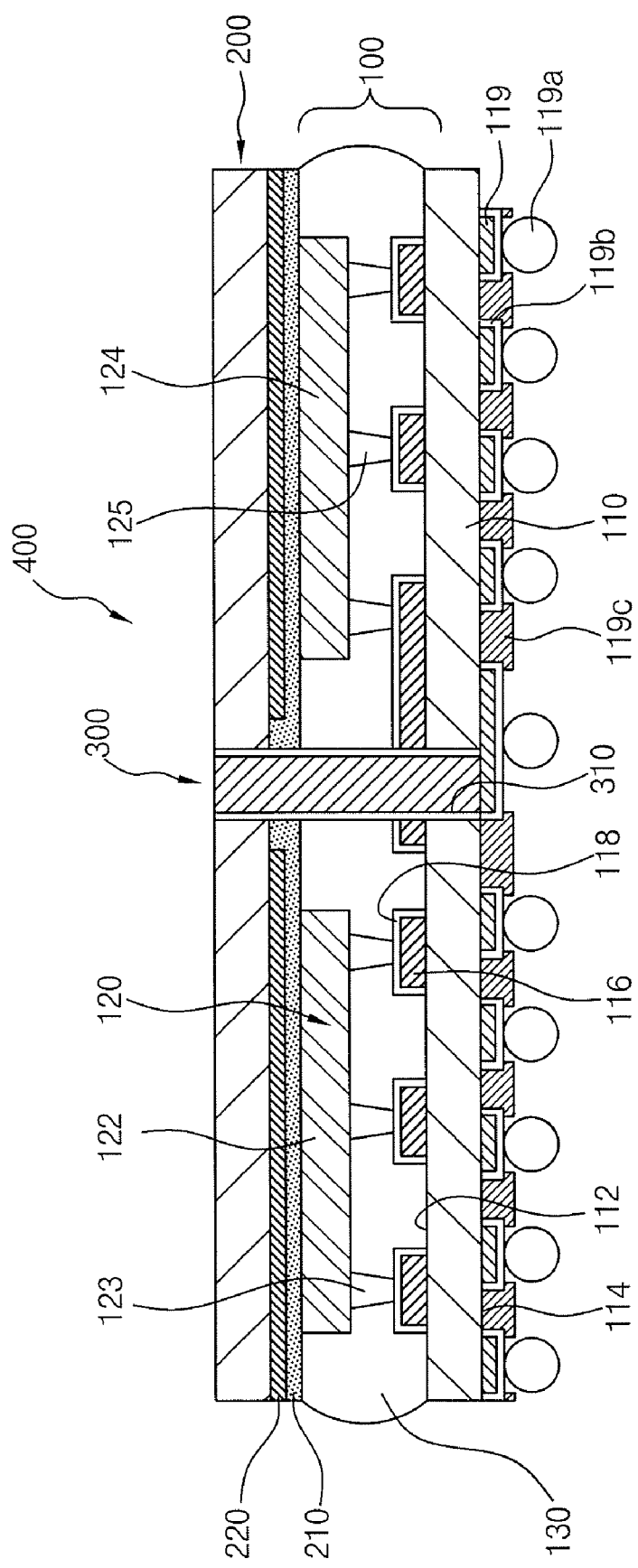
FIG. 4 is a cross-sectional view illustrating a heat dissipation member arranged on the cover plate illustrated in FIG. 1.

FIG. 4 is a cross-sectional view illustrating a heat dissipation member arranged on a cover plate as illustrated in FIG. 1.

Referring to FIG. 4, when the first and second semiconductor chips 122 and 124 input or output data at a high speed, a large amount of heat is generated from the first and second semiconductor chips 122 and 124. The head causes a reduction in the data processing speed of the first and the second semiconductor chips 122 and 124.

In order to swiftly dissipate the heat generated by the first and second semiconductor chips 122 and 124 out of the semiconductor package module 100, the cover plate 200 includes a heat dissipation member 220.

The heat dissipation member 220 may contain a metal with relatively high thermal conductivity. Examples of materials that may be used for the heat dissipation member 220 include copper, copper alloy, aluminum, aluminum alloy, silver, silver alloy, etc.

The heat dissipation member 220 can be interposed between the cover plate 200 and the semiconductor chips 122 and 124. In FIG. 4, the heat dissipation member 220 is arranged between the second semiconductor chips 122 and 124 and the adhesive member 210.

In order to prevent an electrical short between the conductive heat dissipation member 220 and the penetration electrode 300, a penetration hole is formed in the area surrounding the penetration electrode, so that the heat dissipation member 220 does not come into contact with the penetration electrode 300. The diameter of the penetration hole in the heat dissipation member 220 is larger than the penetration electrode 300.

Figure 5:
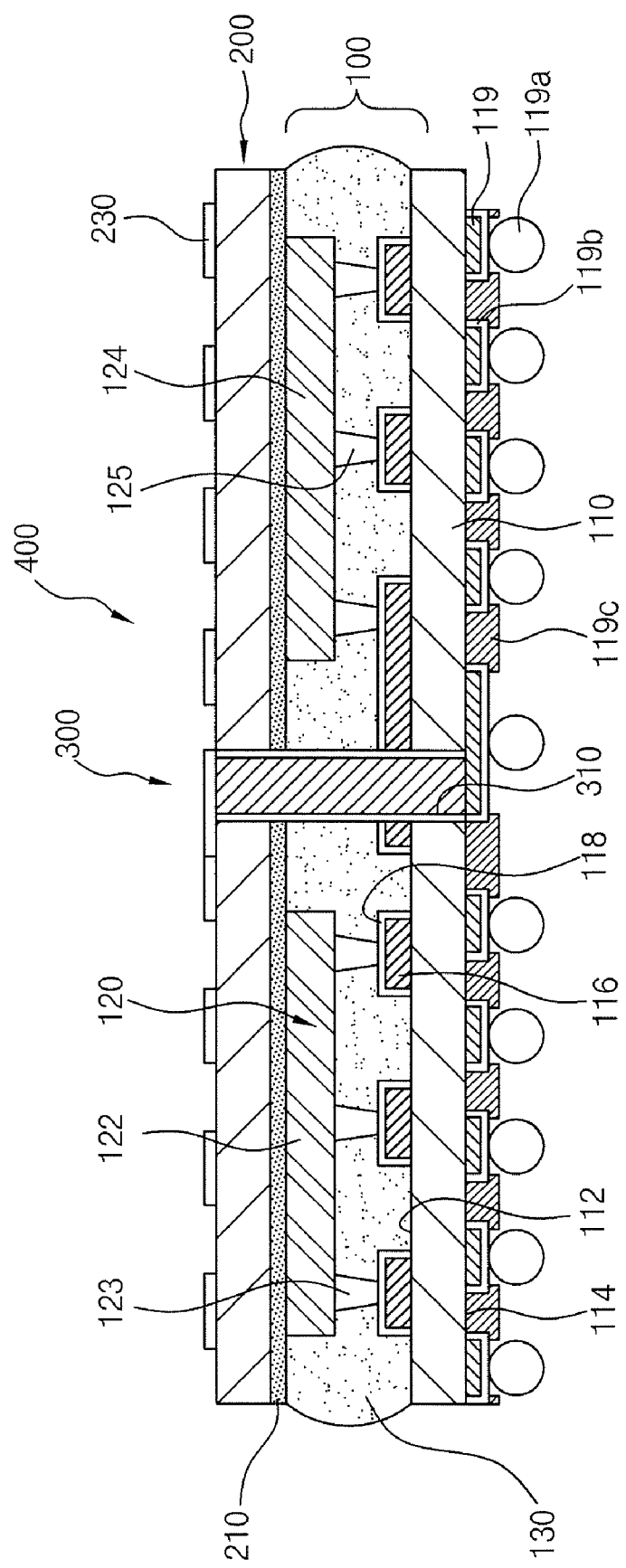
FIG. 5 is a cross-sectional view illustrating additional circuit patterns formed on the cover plate illustrated in FIG. 1.

FIG. 5 is a cross-sectional view illustrating additional circuit patterns formed on a cover plate as illustrated in FIG. 1.

Referring to FIG. 5, the cover plate 200 may include additional circuit patterns 230.

The additional circuit pattern 230 are arranged on the outer surface of the cover plate 200. The additional circuit patterns 230 are electrically connected to the penetration electrode 300 (which will be described in detail later).

The additional circuit patterns 230 can be electrically connected to electrical elements such as transistors, resistors, capacitors and inductors. The additional circuit patterns can also be electrically connected to another semiconductor package.

Referring again to FIG. 1, a penetration electrode 300 penetrates the cover plate 200, insulation member 130, circuit pattern 116, and insulation substrate 110. The penetration electrode 300 is electrically connected to the circuit patterns 116.

In this embodiment, the penetration electrode 300 may be a plating layer. An example of a material that may be used for the penetration electrode 300 is copper, although copper is not the only material that can be used as the penetration electrode. In order to form the penetration electrode 300 using a plating method, a seed metal layer 310 is formed on a surface of the penetration electrode 300.

Figure 6:
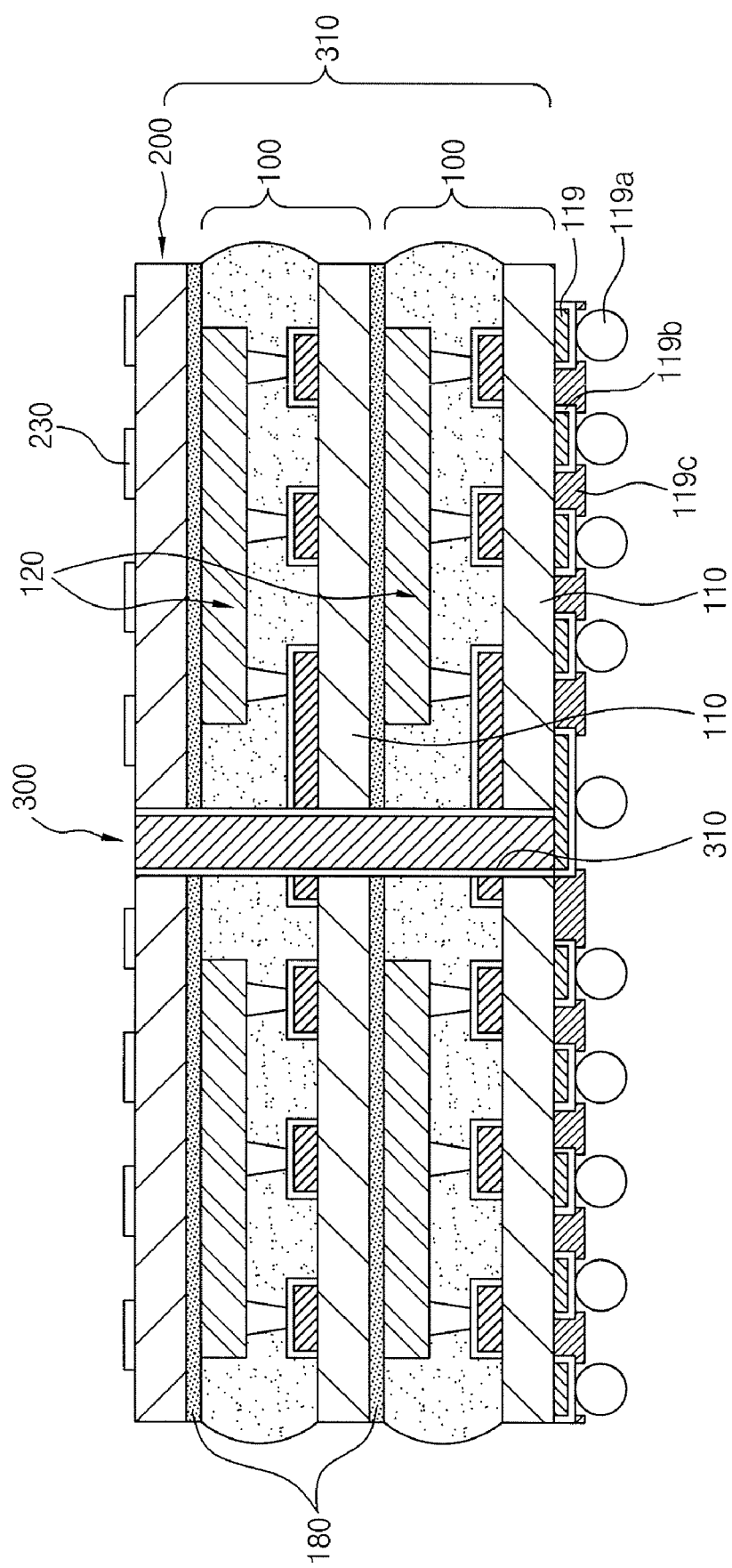
FIG. 6 is a cross-sectional view illustrating a semiconductor package including a plurality of semiconductor package modules.

A semiconductor package 400 comprising a semiconductor package module 100 and a cover plate 200 is described above and illustrated in FIG. 1. Referring to FIG. 6, a stacked semiconductor package 310 can be easily realized by stacking a plurality of semiconductor package modules 100, and using the cover plate 200 of the lower semiconductor package module as the insulation substrate for the upper semiconductor package module 100.

Figure 7:
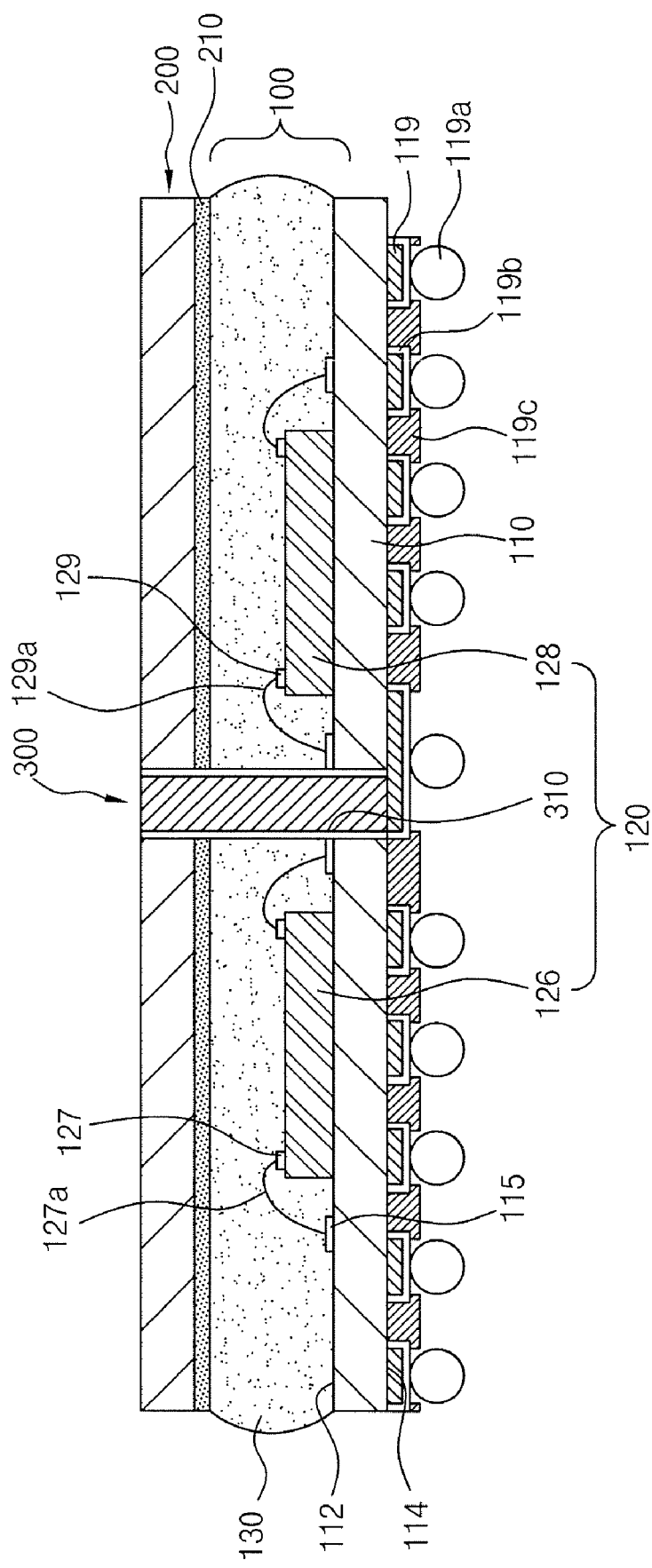
FIG. 7 is a cross-sectional view illustrating a semiconductor package in accordance with a second embodiment of the present invention.

FIG. 7 is a cross-sectional view illustrating a semiconductor package in accordance with a second embodiment of the present invention. A semiconductor package according to a second embodiment of the present invention is substantially similar to the semiconductor package of the first embodiment except for the placement of the semiconductor chips and circuit patterns. Accordingly, explanations for repeat parts will be omitted, and the repeat parts will be given the same description and reference numerals.

In the second embodiment, at least two semiconductor chips may be arranged on an insulation substrate. For explanatory purposes, a two semiconductor chip design will be described. Referring to FIG. 7, at two semiconductor chips 126 and 128 are arranged on an insulation substrate 110. Bonding pads 127 and 129 are arranged on the top surface of the semiconductor chips 126 and 128. The bottom surfaces of the semiconductor chips 126 and 128 are adhered to the insulation substrate 110.

Circuit patterns 115 are arranged on the insulation substrate 110. The circuit patterns 115 are arranged adjacent to the semiconductor chips 126 and 128. Each semiconductor chip is electrically connected to each of the circuit patterns 115. Conductive wires 127a and 120a may be used to connect the semiconductor chips 126 and 128 to the circuit patterns 115.

An insulation member 130 covers the conductive wires 127a and 129a and the semiconductor chips 126 and 128.

The penetration electrode 300 penetrates the circuit patterns 115 arranged between semiconductor chips 126 and 128, and as a result the penetration electrode 300 is electrically connected to the circuit patterns 115 arranged between the semiconductor chips 126 and 128, and these circuit patterns 115 are electrically connected to each other through the penetration electrode.

FIGS. 8 through 17 are cross-sectional views illustrating a method of manufacturing a semiconductor package in accordance with a third embodiment of the present invention.

Figure 8:
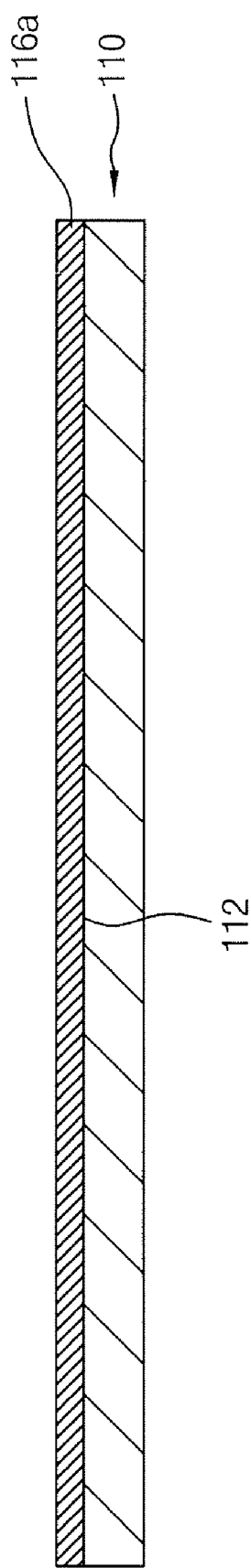
FIGS. 8 through 17 are cross-sectional views illustrating a method of manufacturing a semiconductor package in accordance with a third embodiment of the present invention.
Figure 9:
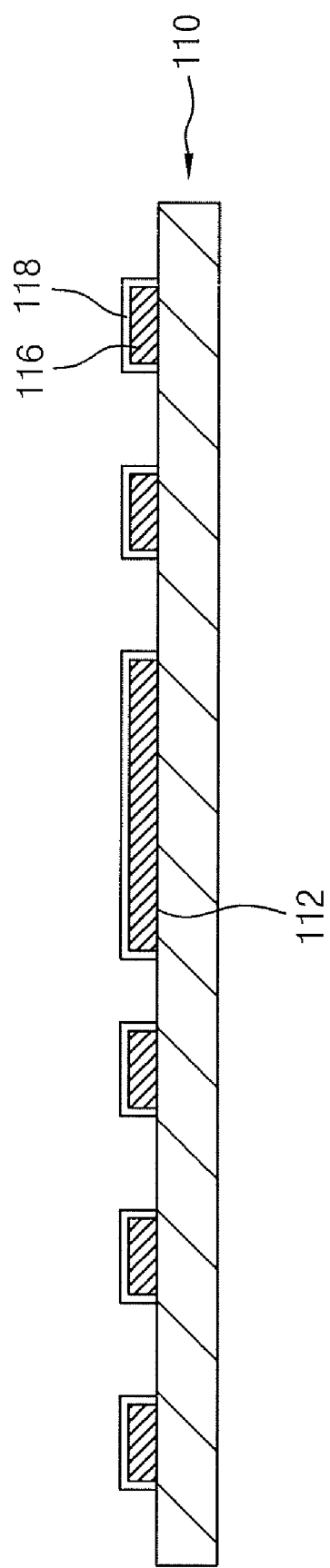

FIGS. 8 and 9 are cross-sectional views illustrating a process for producing circuit patterns on an insulation substrate in accordance with the third embodiment of the present invention.

Referring to FIG. 8, in order to produce circuit patterns on an insulation substrate 110; a metal film 116a is formed on the insulation substrate 110.

In this embodiment, the metal film 116a may be, for example, a copper film. The metal film 116a can be adhered to a first surface 112 of the insulation substrate 110 using a medium of adhesive. Alternatively, the metal film 116a may be formed on the first surface 112 of the insulation substrate 110 using a plating method such as electroless plating.

After the metal film 116a is adhered or formed on the insulation substrate 110, a photoresist film (not shown) is formed on the metal film 116a. The photoresist film is patterned using a photo process, which includes exposure and development processes, to form a photoresist pattern on the metal film 116a.

Referring to FIG. 9, the metal film 116a is patterned using the photoresist pattern as an etching mask to form circuit patterns 116 on a first surface 112 of the insulation substrate 110.

After the circuit patterns 116 are formed on the first surface 112 of the insulation substrate 110, a plating layer 118 may be formed on a surface of the circuit patterns 116. Examples of materials that may be used for the plating layer 118 include gold, nickel, palladium, alloys of these materials, and the like.

Figure 10:
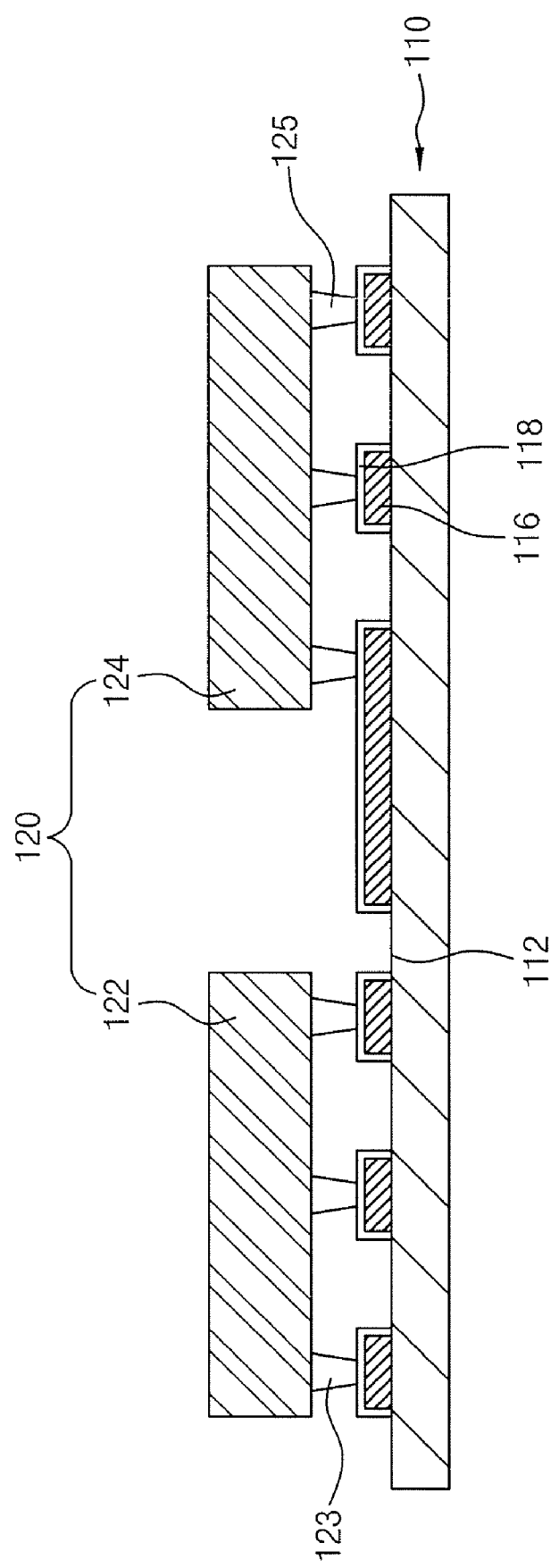

FIG. 10 is a cross-sectional view illustrating semiconductor chips electrically connected to circuit patterns as illustrated in FIG. 9.

Referring to FIG. 10, after circuit patterns are formed, at least two semiconductor chips are electrically connected to the circuit patterns 116. For illustrative purposes, two semiconductors 122 and 124 are shown in FIG. 10. The semiconductor chips 122 and 124 are electrically connected to the circuit patterns 116. Hereinafter, the semiconductor chips 122s and 124 will be referred to as first semiconductor chip 122 and second semiconductor chip 124.

In this embodiment, bonding pads (not shown) are arranged on the top surface of the first and the second semiconductor chips 122 and 124, and solder bumps 123 and 125 are electrically connected to the bonding pads.

The solder bumps 123 and 125 of the first and second semiconductor chips 122 and 124 are connected to the circuit patterns 116 in a flip-chip manner.

Figure 11:
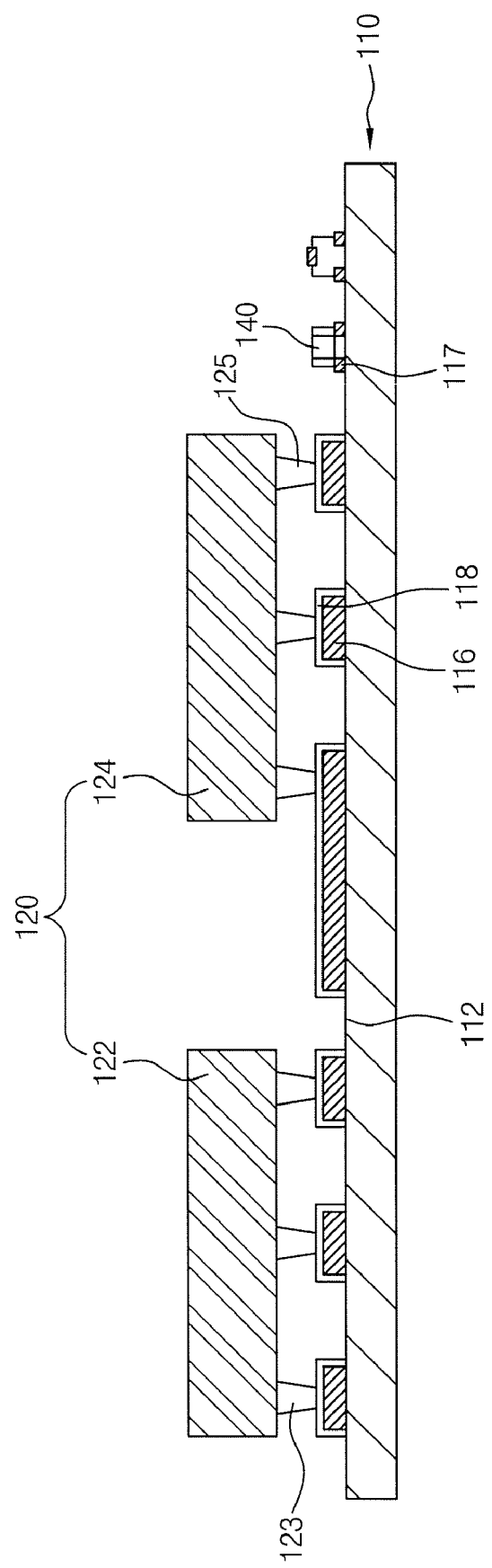

FIG. 11 is a cross-sectional view illustrating electrical elements electrically connected to circuit patterns as illustrated in FIG. 10.

Referring to FIG. 11, when the circuit patterns 116 are formed on the first surface 112 of the insulation substrate 110, circuit patterns for electrical elements 117 may be formed along with the circuit patterns 116. The circuit patterns for electrical elements 117 may be electrically connected to the circuit patterns 116.

The circuit patterns for electrical elements 117 are electrically connected to electrical elements 140. The circuit patterns for electrical elements 117 can be, for example, transistors, capacitors, resistors, inductors, and the like.

Figure 12:
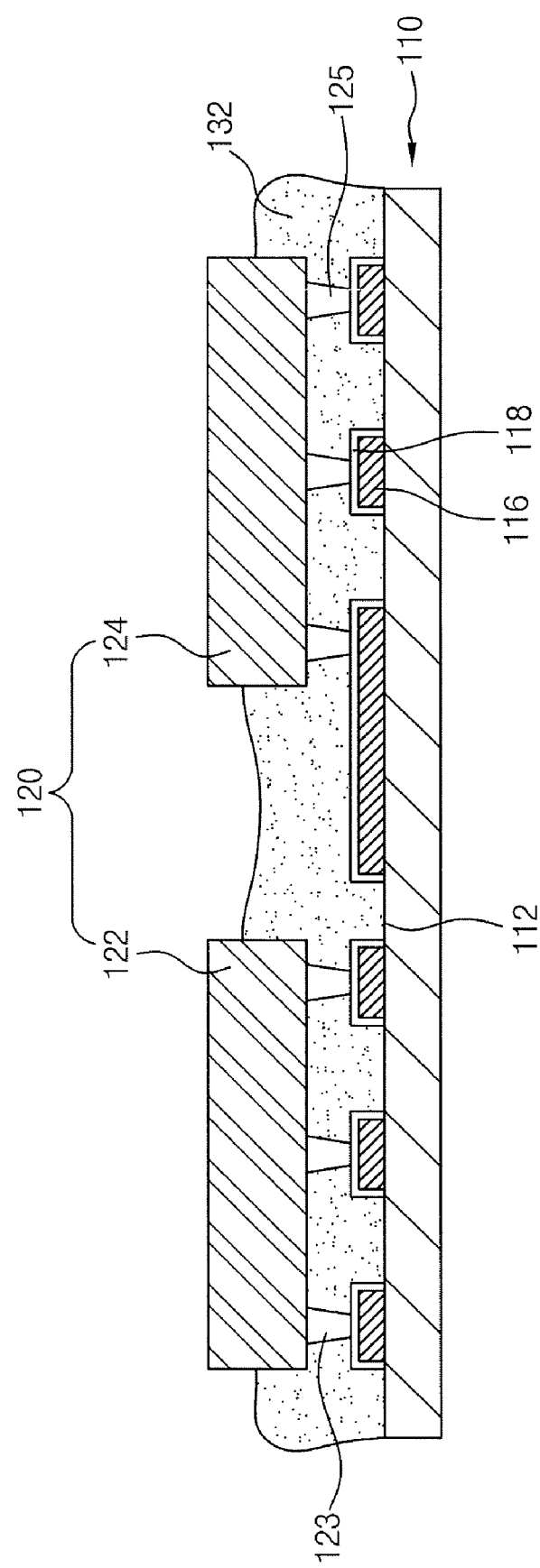

FIG. 12 is a cross-sectional view illustrating a preliminary insulation member coated on an insulation substrate as illustrated in FIG. 10.

Referring to FIG. 12, after the circuit patterns 116 formed on the first surface 112 of the insulation substrate 110 are electrically connected to the first and second semiconductor chips 122 and 124, a preliminary insulation member 132 is formed on the first surface 112 of the insulation substrate 110.

In order to form the preliminary insulation member 132, a fluid insulation material including solvent is coated on the first surface 112 of the insulation substrate 110. The insulation material may be, for example, interposed between the first surface 112 of the insulation substrate 110 and the semiconductor chips 122 and 124, and additionally the insulation material may cover the side surfaces of the semiconductor chips 122 and 124.

In this embodiment, the insulation material contained in the preliminary first insulation member 132 is cured. For example, the insulation material may include a heat-curing material, that is cured by heat.

Figure 13:
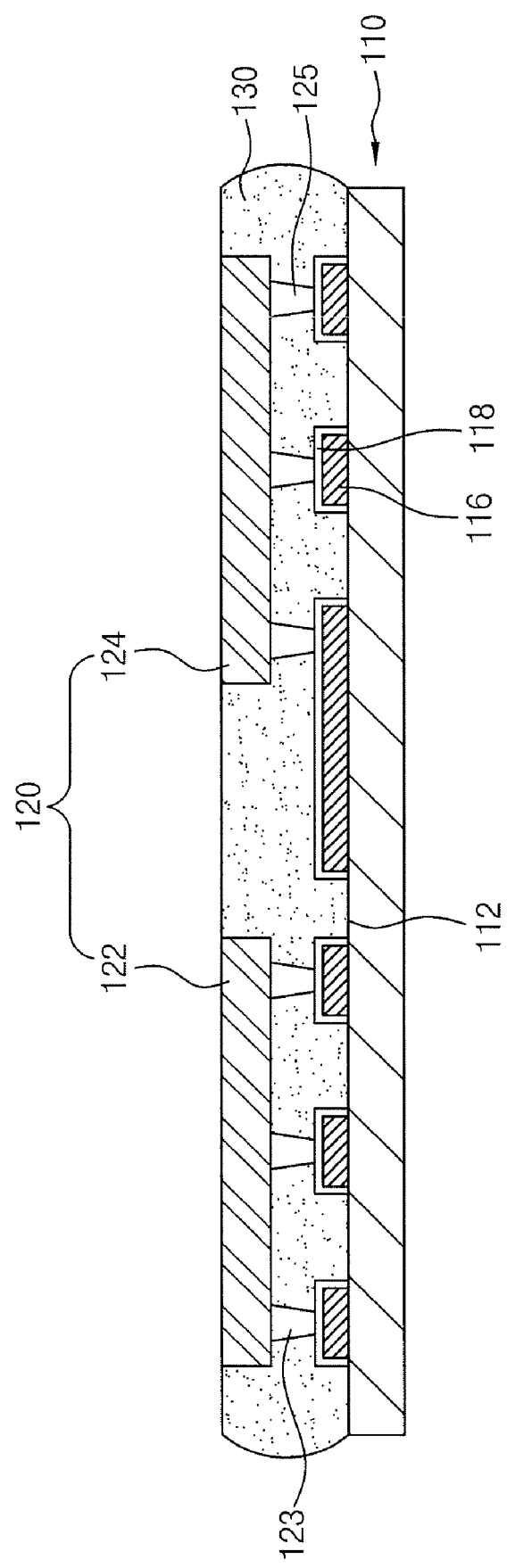

FIG. 13 is a cross-sectional view illustrating the semiconductor chips and preliminary insulation member illustrated in FIG. 12 being polished.

Referring to FIG. 13, A rear surface of the semiconductor chips 122 and 124 is polished, for example, using a chemical-mechanical polishing (CMP) process. Accordingly, the thickness of the semiconductor chips 122 and 124 can be greatly reduced.

Furthermore, while the semiconductor chips 122 and 124 are polished using the CMP process, the preliminary insulation member 132 is also polished, resulting in the polished insulation member 130 as shown in FIG. 13. Once the processes shown in FIGS. 8 through 13 are completed, a semiconductor package module 100 is produced.

Figure 14:
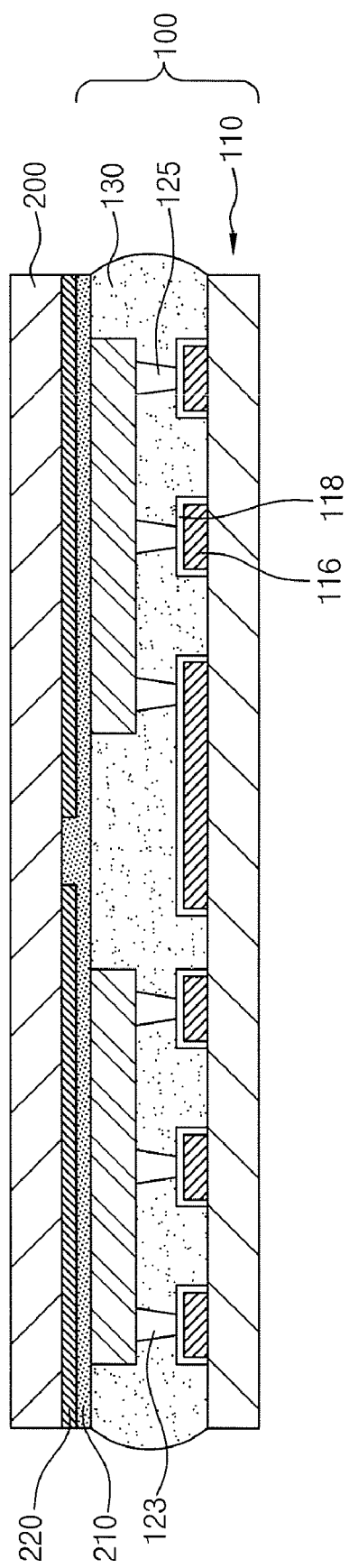

FIG. 14 is a cross-sectional view illustrating a cover plate arranged on a semiconductor package module as illustrated in FIG. 13.

Referring to FIG. 14, after the semiconductor package module 100 as illustrated in FIG. 13 is produced, a cover plate 200 is placed on the polished semiconductor chips 122 and 124 of the semiconductor package module 100.

The cover plate 200 may be, for example, an insulation substrate having a plate-shape. The cover plate 200 protects the semiconductor chips 122 and 124 of the semiconductor package module 100 from externally applied shock and/or vibration.

An adhesive member 210 is formed on the bottom surface (i.e. the surface that faces the semiconductor package module 100) of the cover plate 200. The adhesive member 210 adheres the semiconductor package module 100 to the cover plate 200. The adhesive member 210 may include, for example, an adhesive material melted by heat.

The semiconductor chips 122 and 124 of the semiconductor package module 100 are isolated from the outside by the cover plate 200, insulation substrate 110, and insulation member 130.

Figure 15:
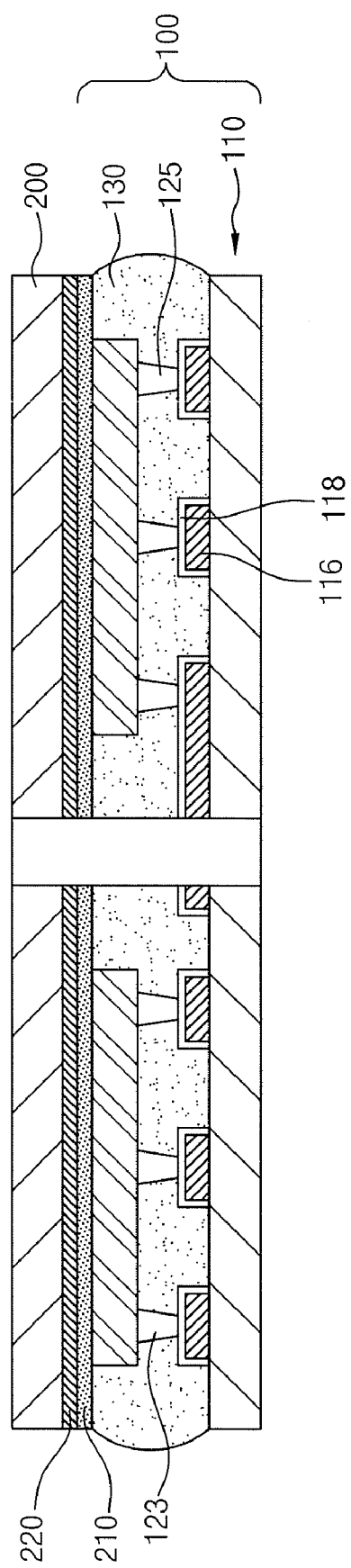

FIG. 15 is a cross-sectional view illustrating a heat dissipation member adhered to the cover plate as illustrated in FIG. 14.

Referring to FIG. 15, when the semiconductor chips 122 and 124 of the semiconductor package module 100 process data at high speeds, the semiconductor chips 122 and 124 generate a large amount of heat. Heat generated from the semiconductor chips 122, 124 greatly impairs the performance of the semiconductor chips 122 and 124.

In order to swiftly dissipate the heat generated by the semiconductor chips 122 and 124, a heat dissipation member 220 is adhered to the bottom surface of the cover plate 200 facing the semiconductor chips 122 and 124.

The heat dissipation member 220 has a plate-shape, and may contain a metal having relatively high thermal conductivity when compared to the semiconductor chips 122 and 124. Examples of material that may be used for the heat dissipation member 220 include copper, copper alloy, aluminum, and aluminum alloy.

A penetration hole may be formed in a portion of the conductive heat dissipation member 220 corresponding to the penetration electrode 300 (which will be described in more detail later). The penetration hole in the heat dissipation member 220 is larger than the penetration electrode 300, thereby keeping the penetration electrode 300 from contacting the heat dissipation member 220. The penetration hole can therefore prevent an electrical short from occurring between the conductive heat dissipation member 220 and the penetration electrode 300.

Figure 16:
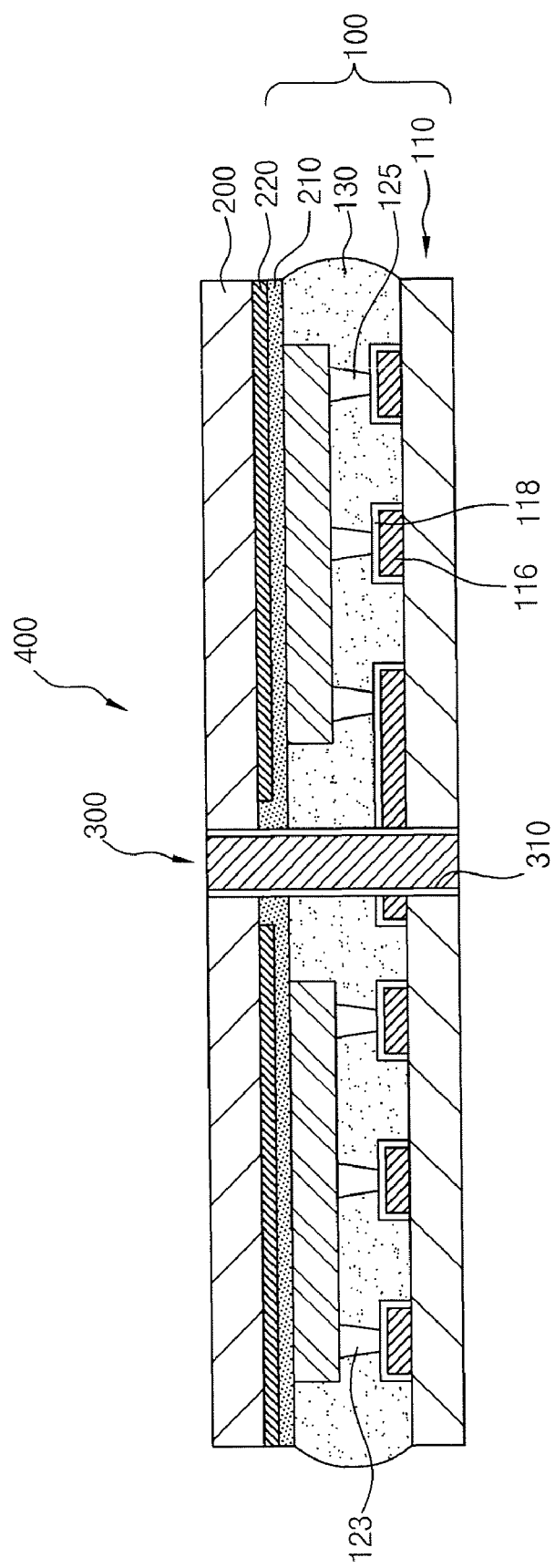

FIG. 16 is a cross-sectional view illustrating a penetration electrode penetrating the semiconductor package module and a cover plate illustrated in FIG. 14.

Referring to FIG. 15, after the cover plate 200 is adhered to the semiconductor package module 100, a via hole penetrating the cover plate 200 and the semiconductor package module 100 is formed. In this embodiment, it is also possible to form a plurality of via holes.

The via hole can be formed, for example, by a drilling process using a drill or a laser drilling process using a laser beam. The via hole penetrates the cover plate 200, insulation member 130, a circuit pattern 116, and the insulation substrate 110.

After forming the via hole, a seed metal layer 310 is formed on the inner surface of the via hole using an electroless plating method. The seed metal layer 310 is then used to form a penetration electrode 300 within the via hole.

Figure 17:
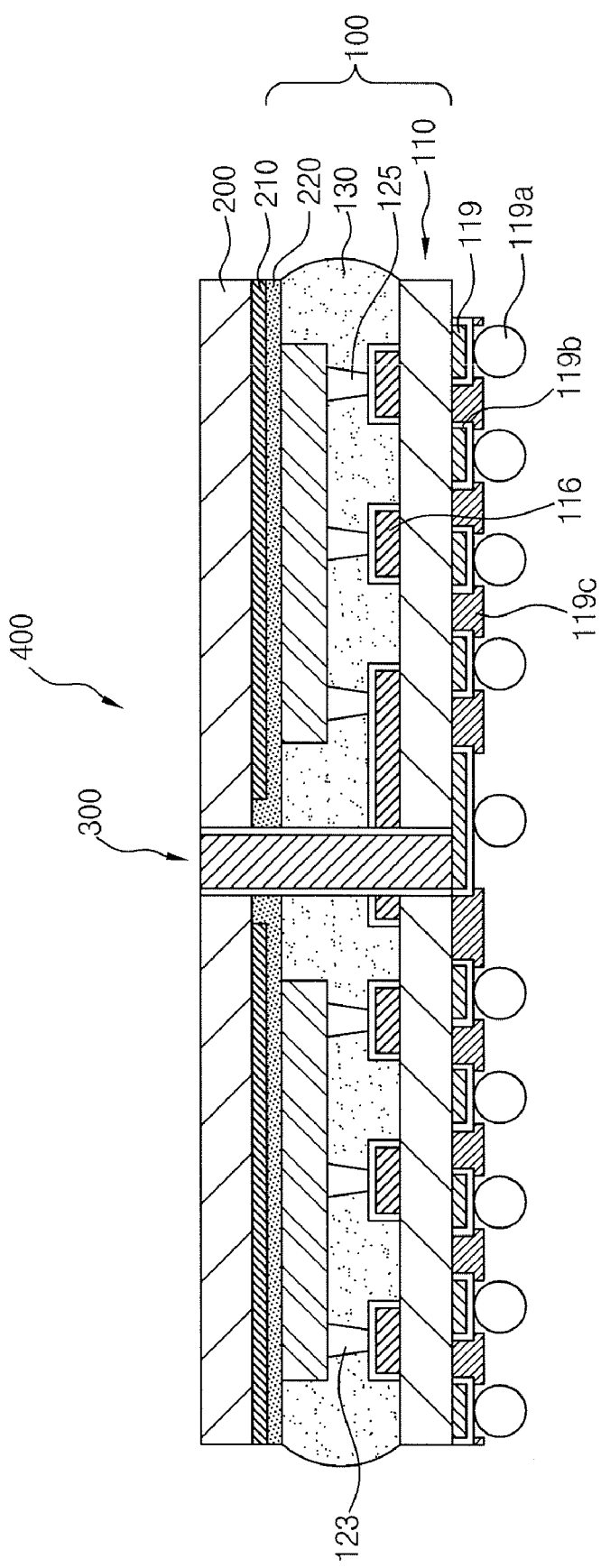

FIG. 17 is a cross-sectional view illustrating external circuit patterns formed on an insulation substrate of the semiconductor package illustrated in FIG. 16.

Referring to FIG. 17, after the semiconductor package 400 having the semiconductor package module 100, cover plate 200, and penetration electrode 300 is produced, external circuit patterns 119 are formed on the outer surface of the insulation substrate 110 of the semiconductor package module 100. In order to form the external circuit patterns 119, a metal film (not shown) is first formed or arranged on the outer surface of the insulation substrate 110 of the semiconductor package 400.

The metal film can be formed on the outer surface of the insulation substrate 110 using a plating method, or the metal film can be adhered to the outer surface of the insulation substrate 110 using an adhesive.

After the metal film is formed on or adhered to the outer surface of the insulation substrate 110, a photoresist film is formed on the metal film. The photoresist film is patterned using a photo process, which includes exposure and development processes, to form a photoresist pattern on the metal film.

The metal film is then patterned using the photoresist pattern as a mask to form external circuit patterns 119 on the insulation substrate 110. The external circuit patterns 119 are electrically connected to the penetration electrode 300.

Although the external circuit patterns 119 are described in FIG. 17 as being formed after the processes described in FIGS. 8-16, the external circuit patterns 119 may also be formed on the insulation substrate 119 when the circuit patterns 116 are formed on the insulation substrate 110.

In process steps above, even though it is illustrated and described that circuit patterns 116 are connected to bumps of the semiconductor chips 122 and 124 in a flip-chip method; as illustrated in FIG. 7, it is also possible to adhere the semiconductor chips 126 and 128 to the insulation substrate 110. The semiconductor chips 126 and 128 can then be electrically connected to circuit patterns 115 arranged adjacent to the semiconductor chips 126 and 128 using conductive wires 127a and 129a. An insulation member 130 can then be used to cover the conductive wires 127a and 129a and the semiconductor chips 127 and 129.

Furthermore, as illustrated in FIG. 6, it is possible to form a stacked semiconductor package by stacking a plurality of semiconductor package modules 100 on one another and using an adhesive member to attach the semiconductor package modules, and then forming a cover plate 200 on the topmost semiconductor package module 100.

As described above in detail, when manufacturing a semiconductor package a process for manufacturing the substrate can be implemented together with a process for packaging semiconductor chips. Manufacturing a semiconductor package in this manner has various beneficial effects including: reduction of the semiconductor package size, large improvements in data processing speed and data storage capacity of a semiconductor package, improvement in the reliability of the semiconductor package, warpage prevention, and swift dissipation of heat generated by the semiconductor chip.

Although the present invention has been illustrated and described herein with respect to specific embodiments, it should not be limited to these embodiments, as those skilled in the art will appreciate that various changes and modifications are possible without departing from the scope and spirit of the invention as disclosed in the accompanying claims.

What is claimed is:

1. A semiconductor package comprising:
  a semiconductor package module comprising:
    an insulation substrate having an upper surface and a lower surface;
    a plurality of circuit patterns formed on the upper surface of the insulation substrate;
    at least two semiconductor chips electrically connected to each of the circuit patterns; and an insulation member filled at least in any space between any combination of the semiconductor chips and the circuit patterns;

a penetration electrode formed to penetrate the semiconductor package module so as to extend between upper and lower surfaces of the semiconductor package module and to penetrate at least the insulation substrate and a circuit pattern of the plurality of circuit patterns, wherein the penetration electrode penetrates through the circuit pattern so as to be electrically connected to the circuit patterns;

a cover plate placed on semiconductor package module and over the semiconductor chips, wherein the cover plate includes a heat dissipation member adhered on an inner surface facing the semiconductor package module to dissipate heat generated from the semiconductor chip, wherein the heat dissipation member includes a penetration hole and the penetration electrode penetrates through the penetration hole, wherein the penetration hole has a thickness that is greater than that of the penetration electrode such that a space is formed between the penetration hole and a portion of the penetration electrode penetrating therethough.

2. The semiconductor package according to claim 1, wherein the circuit patterns contain copper.

3. The semiconductor package according to claim 1 further comprising a plating layer formed on the surface of the circuit patterns, wherein the plating layer includes one of gold, palladium, and nickel.

4. The semiconductor package according to claim 1, further comprising:

a plurality of external circuit patterns formed on the lower surface of the insulation substrate, wherein the external circuit patterns are electrically connected to the penetration electrode;

a plurality of conductive balls, each of which being formed on each external circuit pattern, such that the conductive balls are electrically connected to the external circuit patterns.

5. The semiconductor package according to claim 1 further comprising at least one electrical element disposed on the upper surface of the insulation substrate, wherein the electrical elements are electrically connected to the circuit patterns, and wherein each electrical element includes one of a transistor, a resistor, and a capacitor.

6. The semiconductor package according to claim 1 further comprising a plurality of additional circuit patterns formed on an outer surface of the cover plate, wherein the additional circuit patterns are electrically connected to the penetration electrode.

7. The semiconductor package according to claim 1 further comprising a metal seed layer formed on a surface of the penetration electrode.

8. The semiconductor package according to claim 1, wherein each semiconductor chip comprises a plurality of bumps through which the semiconductor chip is electrically connected to the circuit patterns.

9. The semiconductor package according to claim 1, wherein the semiconductor chips having bonding pads are formed on the insulation substrate such that the semiconductor chips are electrically connected to each of the circuit patterns by conductive wires connecting the bonding pads and the circuit patterns.

10. The semiconductor package according to claim 1, wherein the semiconductor package includes a plurality of semiconductor chip modules stacked upon each other, such that the penetration electrode penetrates each semiconductor package module.

11. The semiconductor package according to claim 1, wherein the penetration electrode penetrates the semiconductor package module at a position that is between the two semiconductor chips when the penetration electrode penetrates the semiconductor package module and the circuit pattern.

12. A semiconductor package comprising:

a semiconductor package module comprising:

an insulation substrate having an upper surface and a lower surface;

a plurality of circuit patterns formed on the upper surface of the insulation substrate;

at least two semiconductor chips electrically connected to each of the circuit patterns; and an insulation member filled at least in any space between any combination of the semiconductor chips and the circuit patterns;

a cover plate placed on semiconductor package module and over the semiconductor chips, and an adhesive member formed between the cover plate and the semiconductor chips so as to adhere the semiconductor chips to a surface of the cover plate facing the upper surface of the insulation substrate on which the circuit patterns are formed, the insulation member being filled between the surfaces of the cover plate and the insulation substrate that face each other;

a penetration electrode penetrating through the cover plate and the semiconductor package module, wherein the penetration electrode is electrically connected to the circuit patterns.

13. The semiconductor package module according to claim 12, wherein the penetration electrode penetrates the circuit pattern between the cover plate and the insulation substrate so as to be electrically connected to the circuit patterns.

14. The semiconductor package according to claim 12, further comprising:

a plurality of external circuit patterns formed on the lower surface of the insulation substrate, wherein the external circuit patterns are electrically connected to the penetration electrode;

a plurality of conductive balls, each of which being formed on each external circuit pattern, such that the conductive balls are electrically connected to the external circuit patterns.

15. The semiconductor package according to claim 12 further comprising at least one electrical element disposed on the upper surface of the insulation substrate, wherein the electrical elements are electrically connected to the circuit patterns, and wherein each electrical element includes one of a transistor, a resistor, and a capacitor.

16. The semiconductor package according to claim 12, wherein the cover plate includes a heat dissipation member adhered on an inner surface facing the semiconductor package module to dissipate heat generated from the semiconductor chip.

17. The semiconductor package according to claim 12 further comprising a plurality of additional circuit patterns formed on an outer surface of the cover plate, wherein the additional circuit patterns are electrically connected to the penetration electrode.

* * * * *